(12) United States Patent
Sun et al.

(10) Patent No.: US 10,192,868 B2
(45) Date of Patent: Jan. 29, 2019

(54) SEMICONDUCTOR DEVICE AND OPERATION THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Yan Lin Sun, Shanghai (CN); Shou Zhu Guo, Shanghai (CN)

(73) Assignees: Semiconductor Manufacturing International (Shanghai) Corporation (CN); Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 15/919,380

(22) Filed: Mar. 13, 2018

(65) Prior Publication Data

US 2018/0261599 A1 Sep. 13, 2018

(30) Foreign Application Priority Data

Mar. 13, 2017 (CN) .......................... 2017 1 0144098

(51) Int. Cl.
*H01L 27/092* (2006.01)
*H03K 17/687* (2006.01)
*H01L 29/06* (2006.01)

(52) U.S. Cl.
CPC ........ *H01L 27/092* (2013.01); *H01L 29/0653* (2013.01); *H03K 17/6872* (2013.01)

(58) Field of Classification Search
CPC ............... H01L 21/82; H01L 21/28273; H01L 21/28282; H01L 29/42344; H01L 29/792; H01L 29/66545; H01L 29/66833; H01L 29/04; H01L 29/76; H01L 29/0653; H01L 27/11568; H01L 27/11573;
(Continued)

(56) References Cited

U.S. PATENT DOCUMENTS 6,034,417 A * 3/2000 Clampitt ........... H01L 21/76232
257/618
8,115,256 B2 * 2/2012 Yoneda ............... H01L 21/8249
257/368
(Continued)

*Primary Examiner* — Thomas Skibinski
(74) *Attorney, Agent, or Firm* — Innovation Counsel LLP

(57) ABSTRACT

A semiconductor device and its operation method, relating to semiconductor technology. The semiconductor device comprises a substrate and an active area on the substrate, wherein the active area comprises a first active area and a second active area positioned along an extension direction of the first active area, the first active area comprises a first component, a second component, and a connection component, wherein the first component and the second component each directly contact a side of the connection component, wherein the second active area comprises a third component and a fourth component being separated by a groove isolation, the groove isolation in the second active area corresponds to the connection component in the first active area. The semiconductor device further comprises a first pseudo gate covering the connection component and the groove isolation. This inventive concept reduces over-etching when forming contact components.

19 Claims, 4 Drawing Sheets

(58) Field of Classification Search
CPC .......... H01L 27/11575; H01L 27/0886; H01L 27/1157; H01L 27/108; H01L 27/092; H03K 17/6872
USPC ........ 327/427, 434, 437; 438/275, 261, 283, 438/157, 197; 257/314, 368, 392, 343, 257/365, 351, 315, 288, 69, 379
See application file for complete search history.

(56) References Cited

U.S. PATENT DOCUMENTS

| | | | |
|---|---|---|---|
| 2009/0149213 A1* | 6/2009 | Zwingman | H01L 21/76264 455/550.1 |
| 2013/0087833 A1* | 4/2013 | Wang | H01L 29/66477 257/192 |
| 2013/0099851 A1* | 4/2013 | Yang | H01L 21/823807 327/434 |
| 2013/0240996 A1* | 9/2013 | Yin | H01L 21/823842 257/368 |
| 2015/0035055 A1* | 2/2015 | Wang | H01L 29/66545 257/339 |
| 2015/0325662 A1* | 11/2015 | Wang | H01L 21/28088 438/589 |
| 2015/0372085 A1* | 12/2015 | Lee | H01L 29/0692 257/387 |

* cited by examiner

SEMICONDUCTOR DEVICE AND OPERATION THEREOF

CROSS-REFERENCE TO RELATED APPLICATION

This application claims priority to and benefit of Chinese Patent Application No. 201710144098.1 filed on Mar. 13, 2017, which is incorporated herein by reference in its entirety.

BACKGROUND

(a) Field of the Invention

This inventive concept relates generally to semiconductor technology, and more specifically, to a semiconductor device and its operation method.

(b) Description of the Related Art

FIG. 1 shows a layout of a conventional logic unit. Referring to FIG. 1, in a conventional logic unit, neighboring cells (e.g., a first cell 21 and a second cell 22) are separated by a Shallow Trench Isolation (STI) 14, and typically a pseudo gate will be formed on a gate layer, for example, as shown in FIG. 1, a pseudo gate 15 is formed on the STI 14.

FIG. 1 also shows an active area 11 of a P-channel Metal Oxide Semiconductor (PMOS) device, an active area 12 of a N-channel Metal Oxide Semiconductor (NMOS) device, gates 13 on the active area 11 and the active area 12, and contact components 16 for the gates, and sources/drains. Conventional, the source/drain of a PMOS device is made of silicon germanium (SiGe) for improved performance.

However, on a PMOS device, SiGe grows slower on the edge of the active area and lacks a uniform morphology, which results in an irregular growth of silicide in succeeding stages. That may cause over-etching when forming contact components and impair device performance.

SUMMARY

The inventors of this inventive concept investigated the issues in conventional techniques and proposed an innovative solution that remedies at least one issue of the conventional techniques.

This inventive concept first presents a semiconductor device, comprising:
a substrate;
an active area on the substrate, wherein the active area comprises:
a first active area; and
a second active area positioned along an extension direction of the first active area, the first active area comprises a first component, a second component, and a connection component, and the first component and the second component each directly contact a side of the connection component, the second active area comprises a third component and a fourth component being separated by a groove isolation, and the groove isolation in the second active area corresponds to the connection component in the first active area; and
a first pseudo gate covering the connection component and the groove isolation.

Additionally, in the aforementioned device, an extension direction of the first pseudo gate may be perpendicular to the extension direction of the first active area.

Additionally, the aforementioned device may further comprise:
a first device based on the first component and a second device based on the second component, the first device comprises a first electrode contact component on the first component at a first side of the connection component, and the first electrode contact component is the closest electrode contact component to the first side of the connection components, the second device comprises a second electrode contact component on the second component at a second side of the connection component, and the second electrode contact component is the closest electrode contact component to the second side of the connection component, and the first side and the second side are two opposing sides of the connection components.

Additionally, in the aforementioned device, the first device and the second device may both be P-channel Metal Oxide Semiconductor (PMOS) devices, and each of the third component and the fourth component may have a N-channel Metal Oxide Semiconductor (NMOS) device. Alternatively, the first device and the second device may both be NMOS devices, and each of the third component and the fourth component may have a PMOS device.

Additionally, in the aforementioned device, the first device and the second device may be electrically isolated from each other.

Additionally, in the aforementioned device, the first electrode contact component and the second electrode contact component may be connected to a same voltage.

Additionally, in the aforementioned device, the substrate may be connected to a first voltage and the first pseudo gate may be connected to a second voltage, and when the first device and the second device are both PMOS devices, the second voltage is higher than or equal to the first voltage, when the first device and the second device are both NMOS devices, the second voltage is lower than or equal to the first voltage.

Additionally, in the aforementioned device, the first device may further comprise:
a first gate and a third electrode contact component on the first component, wherein the first electrode contact component and the third electrode contact component are each at a side of the first gate, and the first electrode contact component is closer to the connection component than the third electrode contact component,
and the second device may further comprise:
a second gate and a fourth electrode contact component on the second component, wherein the second electrode contact component and the fourth electrode contact component are each at a side of the second gate, and the second electrode contact component is closer to the connection component than the fourth electrode contact component.

Additionally, in the aforementioned device, the first active area may comprise a first edge and a second edge each at a side of the connection component, and the device may further comprise a second pseudo gate covering the first edge and a third pseudo gate covering the second edge.

Additionally, in the aforementioned device, the second pseudo gate and the third pseudo gate may also cover an edge of the second active area.

This inventive concept further presents a semiconductor device operation method, comprising:
providing a semiconductor device, comprising:
a substrate;

an active area on the substrate, wherein the active area comprises:
- a first active area; and
- a second active area positioned along an extension direction of the first active area, wherein the first active area comprises a first component, a second component, and a connection component, and the first component and the second component each directly contact a side of the connection component, wherein the second active area comprises a third component and a fourth component being separated by a groove isolation, and wherein the groove isolation in the second active area corresponds to the connection component in the first active area;
- a first pseudo gate covering the connection component and the groove isolation; and
- a first device based on the first component and a second device based on the second component, wherein the first device comprises a first electrode contact component on the first component at a first side of the connection component, and the first electrode contact component is the closest electrode contact component to the first side of the connection components, the second device comprises a second electrode contact component on the second component at a second side of the connection component, and the second electrode contact component is the closest electrode contact component to the second side of the connection component, and wherein the first side and the second side are two opposing sides of the connection components; and electrically isolating the first device and the second device of the semiconductor device.

Additionally, in the aforementioned method, electrically isolating the first device and the second device of the semiconductor device may comprise:
applying a same voltage on the first electrode contact component and the second electrode contact component.

Additionally, in the aforementioned method, electrically isolating the first device and the second device of the semiconductor device may comprise:
applying a first voltage on the substrate; and
applying a second voltage on the first pseudo gate, when both the first device and the second device are PMOS devices, the second voltage is higher than or equal to the first voltage, and when both the first device and the second device are NMOS devices, the second voltage is lower than or equal to the first voltage.

This inventive concept further presents yet another semiconductor device operation method, comprising:
providing a semiconductor device, comprising:
a substrate;
an active area on the substrate, wherein the active area comprises:
- a first active area; and
- a second active area positioned along an extension direction of the first active area, wherein the first active area comprises a first component, a second component, and a connection component, and the first component and the second component each directly contact a side of the connection component, wherein the second active area comprises a third component and a fourth component being separated by a groove isolation, and wherein the groove isolation in the second active area corresponds to the connection component in the first active area;
- a first pseudo gate covering the connection component and the groove isolation; and
- a first device based on the first component and a second device based on the second component, wherein the first device comprises a first electrode contact component on the first component at a first side of the connection component, and the first electrode contact component is the closest electrode contact component to the first side of the connection components, the second device comprises a second electrode contact component on the second component at a second side of the connection component, and the second electrode contact component is the closest electrode contact component to the second side of the connection component, and wherein the first side and the second side are two opposing sides of the connection components,
wherein the first device further comprises: a first gate and a third electrode contact component on the first component, wherein the first electrode contact component and the third electrode contact component are each at a side of the first gate, and the first electrode contact component is closer to the connection component than the third electrode contact component,
and wherein the second device further comprises: a second gate and a fourth electrode contact component on the second component, wherein the second electrode contact component and the fourth electrode contact component are each at a side of the second gate, and the second electrode contact component is closer to the connection component than the fourth electrode contact component; and
electrically isolating the first device and the second device of the semiconductor device.

Additionally, in the aforementioned method, electrically isolating the first device and the second device of the semiconductor device may comprise:
applying a same voltage on the first electrode contact component and the second electrode contact component.

Additionally, in the aforementioned method, electrically isolating the first device and the second device of the semiconductor device may comprise:
applying a first voltage on the substrate; and
applying a second voltage on the first pseudo gate, wherein when both the first device and the second device are PMOS devices, the second voltage is higher than or equal to the first voltage, and when both the first device and the second device are NMOS devices, the second voltage is lower than or equal to the first voltage.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
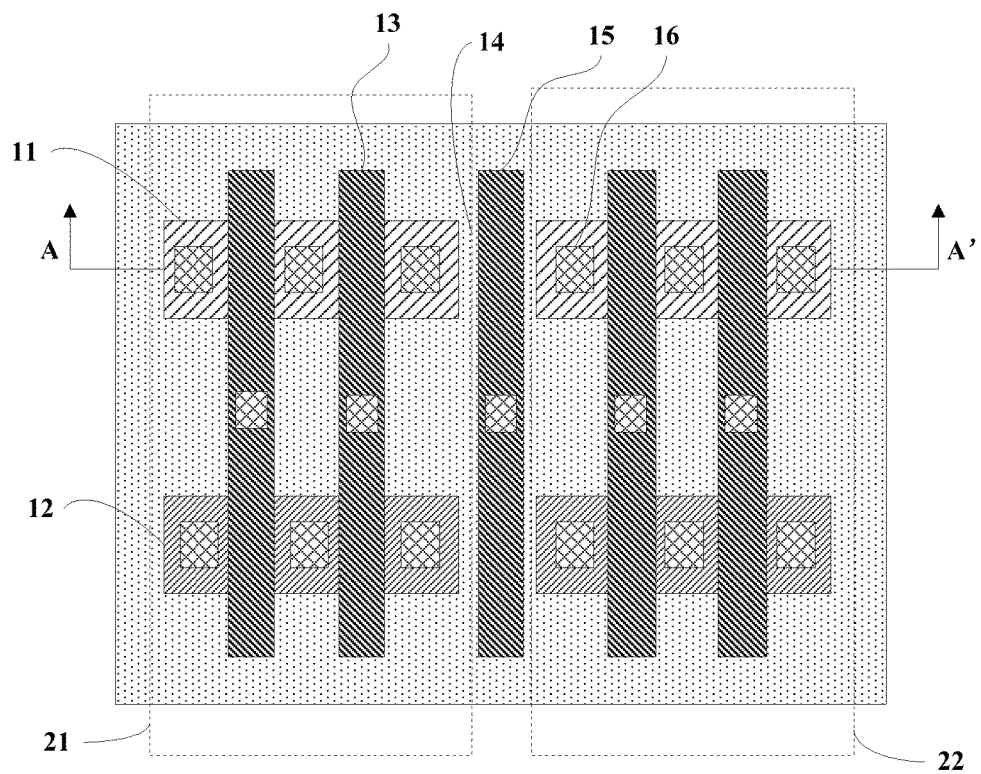
FIG. 1 shows a layout of a conventional logic cell.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

Figure 2A:
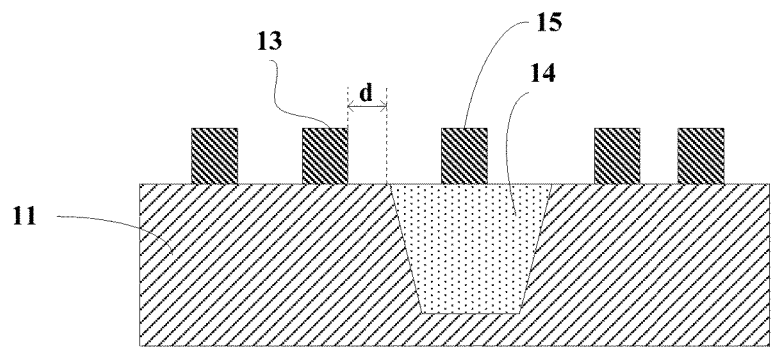
FIGS. 2A, 2B, and 2C show schematic sectional views illustrating different stages of a conventional logic cell manufacturing method.
Figure 2B:
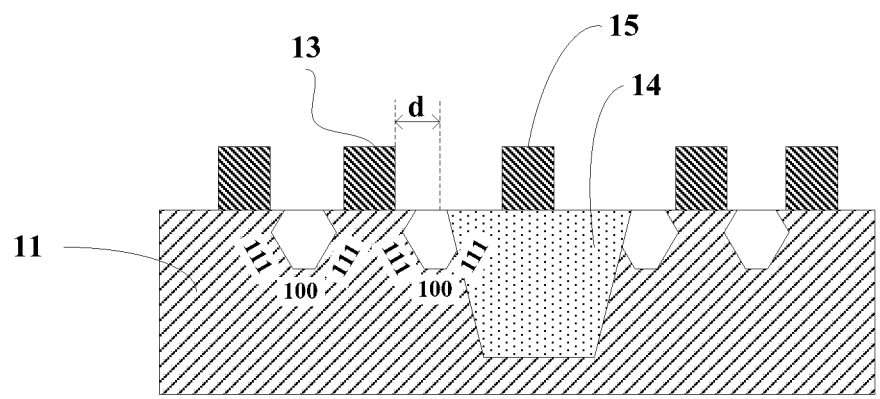
Figure 2C:
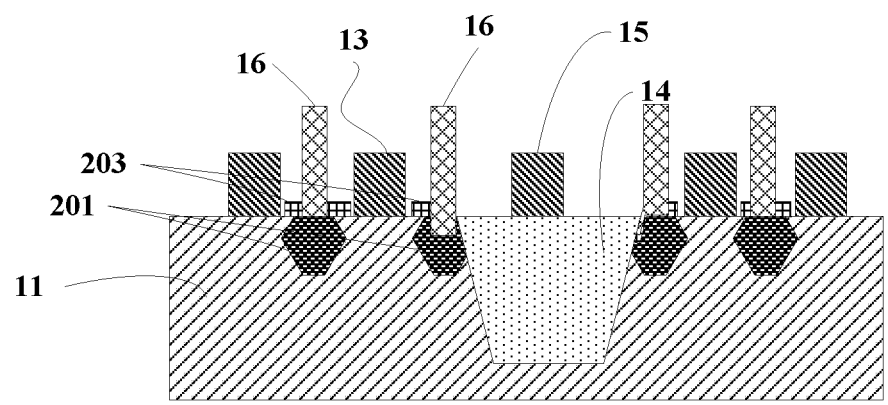

FIGS. 2A, 2B, and 2C show schematic sectional views illustrating different stages of a conventional logic cell manufacturing method, observed along an A-A' direction in FIG. 1. Conventional logic cell manufacturing methods have their limitations.

As shown in FIG. 2A, a distance d between the gate 13 and an edge of the active area is relatively small, and, as shown in FIG. 2B, before growing SiGe, the active area may go through an etching process to expose silicon planes 100 and 111. As shown in FIG. 2B, the STI 14 may cut some silicon planes 100 and 111, particularly those near the STI 14, and result in partial silicon planes 100 and 111.

As shown in FIG. 2C, since some silicon planes 100 and 111 on the edge of the active area (where the source/drain are formed) are incomplete, SiGe 201 on these silicon planes grows slower and has a less uniform morphology than that grown on complete silicon planes 100 and 111, which impairs the growth of silicides 203 in succeeding stages. Additionally, through-holes need to be made on SiGe when forming contact components. Ideally, these through-holes should only be made in the nickel-silicon compound on the SiGe 201 and should not cut into SiGe 201. However, irregular morphology of SiGe 201 on the edge of the active area may cause the through-holes to penetrate the nickel-silicon compound and cut into SiGe, which causes over-etching. The contact component may form a metal-semiconductor contact with SiGe, which increases the contact resistance and impairs device performance, or even causes device failure. Over-etching also increases the leakage current of the device (e.g., to an order of $10^{-9}$ A).

Optimizing SiGe processes theoretically may remedy the limitations of conventional methods. That, however, is challenging in process engineering and does not completely solve the problems. Additionally, a change of process may affect all the devices including those positioned far away from the STI and less affected by these limitations, and therefore may cause issues on production yield and device performance.

The inventors of this inventive concept investigated the issues in conventional techniques and proposed a semiconductor device that remedies at least one issue of the conventional techniques. The semiconductor device of this inventive concept is shown in FIGS. 3A and 3B.

Figure 3A:
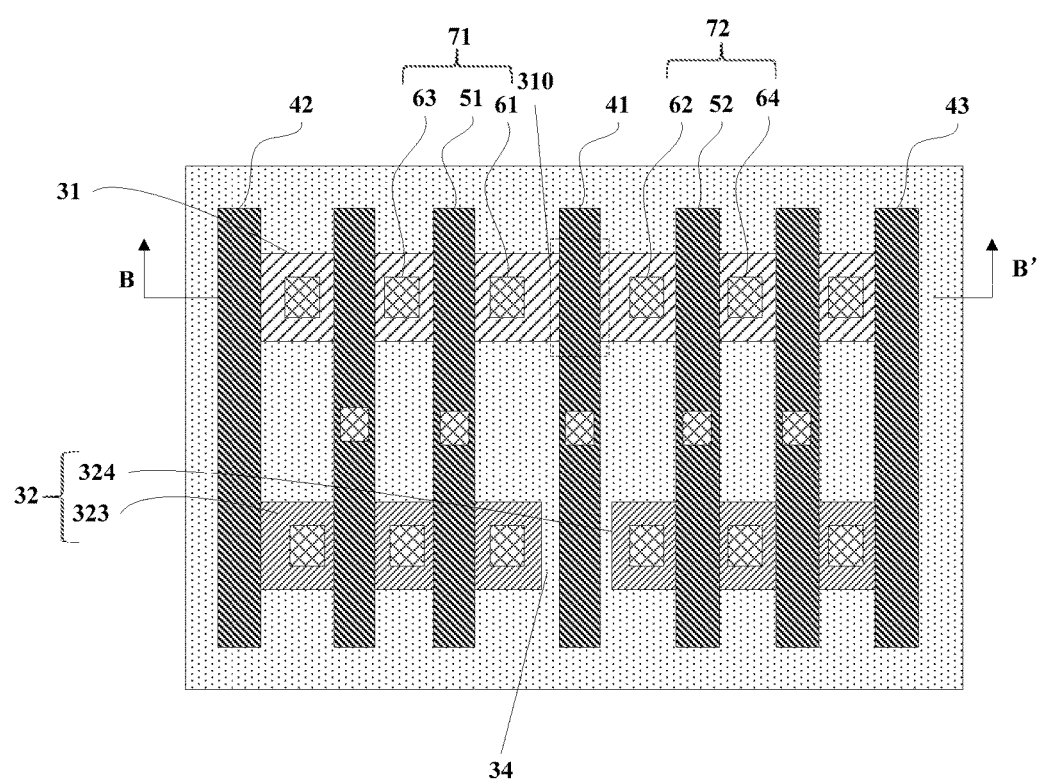
FIG. 3A shows a top view of a semiconductor device in accordance with one or more embodiments of this inventive concept.

FIG. 3A shows a top view of a semiconductor device in accordance with one or more embodiments of this inventive concept. FIG. 3B shows a schematic sectional view of the semiconductor device of FIG. 3A, observed along a B-B' direction in FIG. 3A. The dash lines in the drawings, if there is any, are for illustration purpose only and do not represent any actual component. A semiconductor device of this inventive concept, which may be used as a logic cell, is described below in reference to FIGS. 3A and 3B.

Figure 3B:
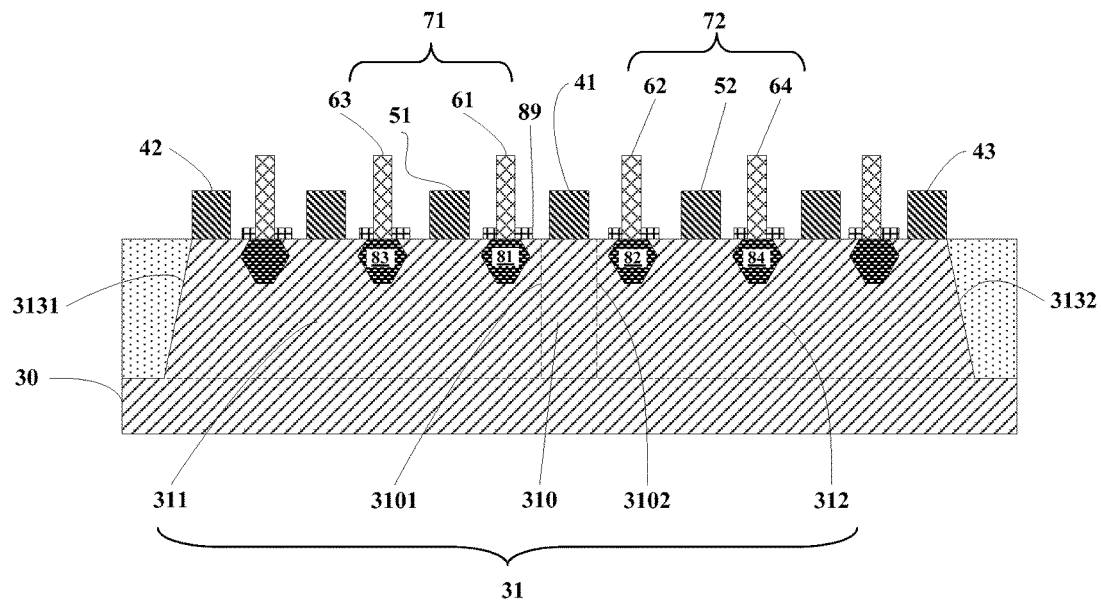
FIG. 3B shows a schematic sectional view of the semiconductor device of FIG. 3A, observed along a B-B' direction in FIG. 3A.

Referring to FIGS. 3A and 3B, the semiconductor device may comprise a substrate 30. The substrate 30 may be a silicon substrate.

Referring to FIGS. 3A and 3B, the semiconductor device may further comprise an active area on the substrate 30. The active area may comprise a first active area 31 and a second active area 32 positioned along an extension direction of the first active area 31. The first active area 31 may comprise a first component 311, a second component 312, and a connection component 310, and the first component 311 and the second component 312 each directly contact a side of the connection component 310. The second active area 32 may comprise a third component 323 and a fourth component 324 being separated by a groove isolation 34 (e.g., a Shallow Trench Isolation (STI)), the groove isolation 34 in the second active area 32 corresponds to the connection component 310 in the first active area 31.

Referring to FIGS. 3A and 3B, the semiconductor device may further comprise a first pseudo gate 41 covering the connection component 310 and the groove isolation 34. The first pseudo gate 41 may be made of polysilicon or a metallic material such as aluminum.

In this embodiment, since the connection component 310 connects the first component 311 and the second component 312 in the first active area 31, there is no groove isolation separating the first component 311 and the second component 312, and therefore the silicon plane (e.g., the silicon plane 100/111 shown in FIG. 2B) will not be cut by the groove isolation and become incomplete, that ensures that the silicon plane will be a complete plane when forming a source/drain (e.g., SiGe) on the edge of the first active area 31. This solves the issues of conventional methods described above, in particular, it reduces over-etching when forming a contact component. Additionally, in this embodiment, the active areas of different devices (e.g., different PMOS devices) are aggregated together, which allows more error tolerance in the manufacturing process.

Referring to FIG. 3A, optimally, an extension direction of the first pseudo gate 41 is perpendicular to the extension direction of the first active area 31. A person of ordinarily skill in the art in this field, however, would understand that these two directions do not have to be perpendicular with each other, an angle between these two directions may be larger or smaller than 90°.

Referring to FIGS. 3A and 3B, in one embodiment, the semiconductor device may further comprise a first device 71 based on the first component 311 and a second device 72 based on the second component 312.

Referring to FIG. 3B, the first device 71 may comprise a first electrode contact component 61 on the first component 311 at a first side 3101 of the connection component 310, the first electrode contact component 61 is the closest electrode contact component to the first side 3101 of the connection component 310. The first device 71 may further comprise a first gate 51 and a third electrode contact component 63 both on the first component 311, the first electrode contact component 61 and the third electrode contact component 63 are each at a side of the first gate 51, and the first electrode contact component 61 is positioned closer to the connection component 310 than the third electrode contact component 63. The first device 71 may further comprise a first electrode (e.g., a drain) 81 and a third electrode (e.g., a source) 83 in the first component 311 and each at a side of the first gate 51. For example, the first electrode 81 and the third electrode 83 may both be made of SiGe. The first electrode contact component 61 is connected to the first electrode 81, and the third electrode contact component 63 is connected to the third electrode 83. The first device 71 may be a device in a logic cell.

Referring to FIG. 3B, the second device 72 may comprise a second electrode contact component 62 on the second component 312 at a second side 3102 of the connection component 310, the second electrode contact component 62 is the closest electrode contact component to the second side 3102 of the connection component 310, and the first side 3101 and the second side 3102 are two opposing sides of the connection component 310. The second device 72 may further comprise a second gate 52 and a fourth electrode contact component 64 both on the second component 312, the second electrode contact component 62 and the fourth electrode contact component 64 are each at a side of the second gate 52, and the second electrode contact component 62 is positioned closer to the connection component 310 than the fourth electrode component 64. The second device 72 may further comprise a second electrode (e.g., a drain) 82 and a fourth electrode (e.g., a source) 84 in the second component 312 and each at a side of the second gate 52. For example, the second electrode 82 and the fourth electrode 84 may both be made of SiGe. The second electrode contact component 62 is connected to the second electrode 82, and the fourth electrode component 64 is connected to the fourth electrode 84. The second device 72 may be a device in a logic cell.

Referring to FIG. 3B, optionally, both the first device 71 and the second device 72 may further comprise a silicide layer 89 on the active area, and the electrode contact components go through the silicide layer 89 and contact with the corresponding electrodes. For example, the first electrode contact component 61 goes through the silicide layer 89 and contacts the first electrode 81. Other electrode contact components contact the corresponding electrodes in a similar manner and hence is not repeatedly described here.

It should be understood that, for purposes of conciseness and convenience, some components or procedures that are well known to one of ordinary skill in the art in this field are omitted. For example, gate insulation layers and spacers are omitted from the description presented above. These omissions, however, do not prevent one of ordinary skill in the art in this field to make and use the inventive concept herein disclosed.

In one embodiment, the first device 71 and the second device 72 may both be PMOS devices, and the third component 323 and the fourth component 324 of the second active area 32 may each have a NMOS device formed on it. In another embodiment, the first device 71 and the second device 72 may both be NMOS devices, and the third component 323 and the fourth component 324 of the second active area 32 may each have a PMOS device formed on it.

In one embodiment, the first device 71 and the second device 72 may be electrically isolated from each other, that is, the logic cell of the first device 71 is electrically isolated from the logic cell of the second device 72, thus these two logic cells do not affect each other.

In one embodiment, the first electrode contact component 61 and the second electrode contact component 62 are connected to a same voltage. In this embodiment, since the electrode contact components that are closest to the connection component 310 at each side of the connection component 310 are connected to a same voltage, there is no current in the active area beneath the first pseudo gate 41, and hence the first device 71 and the second device 72 are electrically isolated from each other.

In another embodiment, the substrate 30 is connected to a first voltage and the first pseudo gate 41 is connected to a second voltage. In one example, when the first device 71 and the second device 72 are both PMOS devices, the second voltage is higher than or equal to the first voltage. That is, when the devices at two sides of the connection component 310 are both PMOS devices, the first pseudo gate 41 on the connection component 310 is connected to a high voltage (e.g., Vdd), thus a transistor based on the first pseudo gate 41 is in a cutoff status and the first device 71 is electrically isolated from the second device 72. In another example, when the first device 71 and the second device 72 are both NMOS devices, the second voltage is lower than or equal to the first voltage. That is, when the devices at two sides of the connection components 310 are both NMOS devices, the first pseudo gate 41 on the connection component 310 is connected to a low voltage, thus a transistor based on the first pseudo gate 41 is in a cutoff status and the first device 71 is electrically isolated from the second device 72.

It should be understood that the methods that can be used to electrically isolate the first device from the second device are not limited to the methods described here, and a person of ordinarily skill in the art in this field would understand that other well-known methods may also be used to electrically isolate these two devices.

In the embodiment described above, the first device is electrically isolated from the second device, which reduces the leakage current (e.g., to an order of $10^{-11}$ A) and improves device performance.

Referring to FIG. 3B, in one embodiment, the first active area 31 may comprise a first edge 3131 and a second edge 3132 each at a side of the connection component 310. The semiconductor device may further comprise a second pseudo gate 42 on the first edge 3131 and a third pseudo gate 43 on the second edge 3132. For example, the length of the first active area 31 may be extended and the second pseudo gate 42 and the third pseudo gate 43 may be formed on the edge of the first active area 31, thus the pseudo gates may be formed by existing pseudo gate manufacturing processes.

In this embodiment, pseudo gates are formed on the edge of the active area, which prevents over-etching on the edge of the active area before a source/drain is formed. This also prevents forming a source/drain of an irregular morphology, and thus prevents over-etching when forming contact components.

Referring to FIG. 3A, optionally, the second pseudo gate 42 and the third pseudo gate 43 may also cover an edge of the second active area 32. For example, the second pseudo gate 42 may cover an edge of the third component 323 of the second active area 32, and the third pseudo gate 43 may cover an edge of the fourth component 324 of the second active area 32. This allows a normal growth of a source/drain on the edge of the second active area 32, and prevents over-etching when forming contact components.

This concludes the description of a semiconductor device in accordance with one or more embodiments of this inventive concept. In these embodiments, an active area has two components that are connected by a connection component, a person of ordinarily skill in the art in this field would understand that an active area may have more than two components and more than one connection components may connect these components together.

Figure 4:
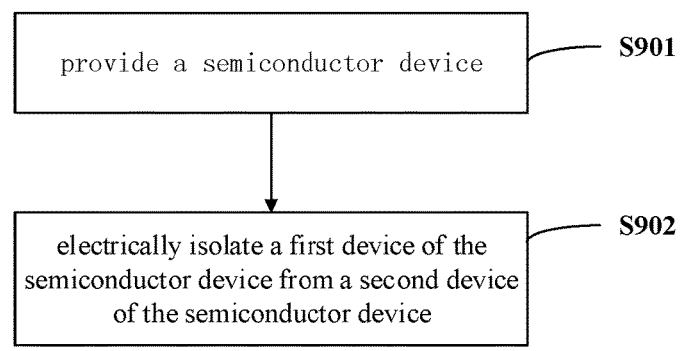
FIG. 4 shows a flowchart illustrating an operation method of a semiconductor device in accordance with one or more embodiments of this inventive concept.

Based on the semiconductor device described above, this inventive concept further presents an operation method of this semiconductor device. FIG. 4 shows a flowchart illustrating an operation method of a semiconductor device in accordance with one or more embodiments of this inventive concept.

Referring to FIG. 4, in step S901, a semiconductor device as described above is provided.

In step S902, the first device of the semiconductor device is electrically isolated from the second device of the semiconductor device.

In this embodiment, electrically isolating the first device from the second device reduces the leakage current and improves the performance of the semiconductor device.

In one embodiment, step S902 may comprise applying a same voltage on both the first electrode contact component and the second electrode contact component. In this embodiment, since a same voltage is applied on the electrode contact components that are closest to the connection components at two sides of the connection components, the devices at two sides of the connection components (i.e., the first device and the second device) are electrically isolated.

In another embodiment, step S902 may comprise applying a first voltage on the substrate and applying a second voltage on the first pseudo gate.

For example, when both the first device and the second device are PMOS devices, the second voltage is higher than or equal to the first voltage. That is, when the devices at both sides of the connection component are PMOS devices, the first pseudo gate on the connection component is connected to a high voltage (e.g., Vdd), thus a transistor based on the first pseudo gate is in a cutoff status and the first device is electrically isolated from the second device.

When both the first device and the second device are NMOS devices, the second voltage is lower than or equal to the first voltage. That is, when the devices at both sides of the connection component are NMOS devices, the first pseudo gate on the connection component is connected to a low voltage, thus a transistor based on the first pseudo gate is in a cutoff status and the first device is electrically isolated from the second device.

This concludes the description of a semiconductor device and its operation method in accordance with one or more embodiments of this inventive concept. In the interest of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device, comprising:
    a substrate;
    an active area on the substrate, wherein the active area comprises:
        a first active area; and
        a second active area positioned along an extension direction of the first active area, wherein the first active area comprises a first component, a second component, and a connection component, and the first component and the second component each directly contact a side of the connection component, wherein the second active area comprises a third component and a fourth component being separated by a groove isolation, and wherein the groove isolation in the second active area corresponds to the connection component in the first active area; and
    a first pseudo gate covering the connection component and the groove isolation.

2. The device of claim 1, wherein an extension direction of the first pseudo gate is perpendicular to the extension direction of the first active area.

3. The device of claim 1, further comprising:
    a first device based on the first component and a second device based on the second component, wherein the first device comprises a first electrode contact component on the first component at a first side of the connection component, and the first electrode contact component is the closest electrode contact component to the first side of the connection components, the second device comprises a second electrode contact component on the second component at a second side of the connection component, and the second electrode contact component is the closest electrode contact component to the second side of the connection component, and wherein the first side and the second side are two opposing sides of the connection components.

4. The device of claim 3, wherein the first device and the second device are both P-channel Metal Oxide Semiconductor (PMOS) devices, and each of the third component and the fourth component has a N-channel Metal Oxide Semiconductor (NMOS) device.

5. The device of claim 4, wherein the first electrode contact component and the second electrode contact component are connected to a same voltage.

6. The device of claim 4, wherein the substrate is connected to a first voltage and the first pseudo gate is connected to a second voltage that is higher than or equal to the first voltage.

7. The device of claim 3, wherein the first device and the second device are both NMOS devices, and each of the third component and the fourth component has a PMOS device.

8. The device of claim 7, wherein the first electrode contact component and the second electrode contact component are connected to a same voltage.

9. The device of claim 7, wherein the substrate is connected to a first voltage and the first pseudo gate is connected to a second voltage that is lower than or equal to the first voltage.

10. The device of claim 3, wherein the first device and second device are electrically isolated from each other.

11. The device of claim 3, wherein the first device further comprises:
    a first gate and a third electrode contact component on the first component, wherein the first electrode contact component and the third electrode contact component are each at a side of the first gate, and the first electrode contact component is closer to the connection component than the third electrode contact component,
    and wherein the second device further comprises:
    a second gate and a fourth electrode contact component on the second component, wherein the second electrode contact component and the fourth electrode contact component are each at a side of the second gate, and the second electrode contact component is closer to the connection component than the fourth electrode contact component.

12. The device of claim 1, wherein the first active area comprises a first edge and a second edge each at a side of the connection component, and the device further comprises:
    a second pseudo gate covering the first edge and a third pseudo gate covering the second edge.

13. The device of claim 12, wherein the second pseudo gate and the third pseudo gate also cover an edge of the second active area.

14. A semiconductor device operation method, comprising:
    providing a semiconductor device, comprising:
        a substrate;
        an active area on the substrate, wherein the active area comprises:
            a first active area; and
            a second active area positioned along an extension direction of the first active area, wherein the first active area comprises a first component, a second component, and a connection component, and the first component and the second component each directly contact a side of the connection component, wherein the second active area comprises a third component and a fourth component being separated by a groove isolation, and wherein the groove isolation in the second active area corresponds to the connection component in the first active area;

a first pseudo gate covering the connection component and the groove isolation; and a first device based on the first component and a second device based on the second component, wherein the first device comprises a first electrode contact component on the first component at a first side of the connection component, and the first electrode contact component is the closest electrode contact component to the first side of the connection components, the second device comprises a second electrode contact component on the second component at a second side of the connection component, and the second electrode contact component is the closest electrode contact component to the second side of the connection component, and wherein the first side and the second side are two opposing sides of the connection components; and electrically isolating the first device and the second device of the semiconductor device.

15. The method of claim 14, wherein electrically isolating the first device and the second device of the semiconductor device comprises:

applying a same voltage on the first electrode contact component and the second electrode contact component.

16. The method of claim 14, wherein electrically isolating the first device and the second device of the semiconductor device comprises:

applying a first voltage on the substrate; and applying a second voltage on the first pseudo gate, wherein when both the first device and the second device are P-channel Metal Oxide Semiconductor (PMOS) devices, the second voltage is higher than or equal to the first voltage, and when both the first device and the second device are N-channel Metal Oxide Semiconductor (NMOS) devices, the second voltage is lower than or equal to the first voltage.

17. A semiconductor device operation method, comprising:

providing a semiconductor device, comprising:
a substrate;
an active area on the substrate, wherein the active area comprises:
a first active area; and
a second active area positioned along an extension direction of the first active area, wherein the first active area comprises a first component, a second component, and a connection component, and the first component and the second component each directly contact a side of the connection component, wherein the second active area comprises a third component and a fourth component being separated by a groove isolation, and wherein the groove isolation in the second active area corresponds to the connection component in the first active area;

a first pseudo gate covering the connection component and the groove isolation; and a first device based on the first component and a second device based on the second component, wherein the first device comprises a first electrode contact component on the first component at a first side of the connection component, and the first electrode contact component is the closest electrode contact component to the first side of the connection components, the second device comprises a second electrode contact component on the second component at a second side of the connection component, and the second electrode contact component is the closest electrode contact component to the second side of the connection component, and wherein the first side and the second side are two opposing sides of the connection components, wherein the first device further comprises: a first gate and a third electrode contact component on the first component, wherein the first electrode contact component and the third electrode contact component are each at a side of the first gate, and the first electrode contact component is closer to the connection component than the third electrode contact component, and wherein the second device further comprises: a second gate and a fourth electrode contact component on the second component, wherein the second electrode contact component and the fourth electrode contact component are each at a side of the second gate, and the second electrode contact component is closer to the connection component than the fourth electrode contact component; and electrically isolating the first device and the second device of the semiconductor device.

18. The method of claim 17, wherein electrically isolating the first device and the second device of the semiconductor device comprises:

applying a same voltage on the first electrode contact component and the second electrode contact component.

19. The method of claim 17, wherein electrically isolating the first device and the second device of the semiconductor device comprises:

applying a first voltage on the substrate; and applying a second voltage on the first pseudo gate, wherein when both the first device and the second device are P-channel Metal Oxide Semiconductor (PMOS) devices, the second voltage is higher than or equal to the first voltage, and when both the first device and the second device are N-channel Metal Oxide Semiconductor (NMOS) devices, the second voltage is lower than or equal to the first voltage.

* * * * *